United States Patent
Bailey et al.

(10) Patent No.: US 11,277,943 B2
(45) Date of Patent: Mar. 15, 2022

(54) MODULAR DATA CENTER HAVING AN AIR COOLED EXTERNAL EQUIPMENT PANEL

(71) Applicant: DELL PRODUCTS, L.P., Round Rock, TX (US)

(72) Inventors: Mark M. Bailey, Round Rock, TX (US); Trey S. Wiederhold, Cedar Park, TX (US); Tyler B. Duncan, Austin, TX (US); James S. Davis, Round Rock, TX (US)

(73) Assignee: Dell Products, L.P., Round Rock, TX (US)

( * ) Notice: Subject to any disclaimer, the term of this patent is extended or adjusted under 35 U.S.C. 154(b) by 21 days.

(21) Appl. No.: 16/685,866

(22) Filed: Nov. 15, 2019

(65) Prior Publication Data

US 2021/0153389 A1    May 20, 2021

(51) Int. Cl.
*H05K 7/20*    (2006.01)
*H05K 5/06*    (2006.01)

(52) U.S. Cl.
CPC ......... *H05K 7/20754* (2013.01); *H05K 5/06* (2013.01); *H05K 7/202* (2013.01); *H05K 7/20127* (2013.01)

(58) Field of Classification Search
CPC ...... H05K 5/06; H05K 7/20127; H05K 7/202; H05K 7/20754
See application file for complete search history.

(56) References Cited

U.S. PATENT DOCUMENTS

| | | | |
|---|---|---|---|
| 5,929,762 A | 7/1999 | Missimer, Jr. | |
| 7,752,858 B2 | 7/2010 | Johnson et al. | |
| 9,236,717 B2 | 1/2016 | Bravo et al. | |
| 10,178,794 B1 | 1/2019 | Bailey et al. | |
| 2008/0064317 A1* | 3/2008 | Yates | H05K 7/1497 454/118 |
| 2012/0125028 A1* | 5/2012 | Keisling | G06F 1/20 62/228.1 |
| 2014/0103678 A1* | 4/2014 | Slessman | H05K 7/20745 296/24.3 |
| 2015/0237768 A1* | 8/2015 | Endo | G05B 15/02 361/679.49 |
| 2017/0359922 A1* | 12/2017 | Bailey | H05K 7/1498 |
| 2018/0212406 A1 | 7/2018 | Dall'Agnol et al. | |
| 2019/0254198 A1* | 8/2019 | Magallanes | H05K 7/20754 |
| 2019/0335623 A1* | 10/2019 | Gao | H05K 7/202 |

* cited by examiner

*Primary Examiner* — Jacob R Crum
(74) *Attorney, Agent, or Firm* — Isidore PLLC

(57) ABSTRACT

A modular data center (MDC) has an air handling system that air cools a volumetric container and heat-generating equipment contained in externally attached equipment panels. Heat-generating information technology (IT) component(s) are positioned within the volumetric container with a cold aisle defined on one side and a hot aisle defined on another side of the IT component(s). The IT component(s) has air-cooling air passages that fluidly communicate between the cold and the hot aisles. A cooling unit pressurizes the cold aisle with supply air and draws return air from the hot aisle. The equipment panel(s) are externally attached to an exterior wall of the volumetric container. A supply air conduit directs supply air from the cold aisle into the equipment panel(s). A return air conduit directs air warmed by the heat-generating equipment inside the equipment panel into the hot aisle from the equipment panel(s) that receives the supply air.

20 Claims, 9 Drawing Sheets

MODULAR DATA CENTER HAVING AN AIR COOLED EXTERNAL EQUIPMENT PANEL

BACKGROUND

1. Technical Field

The present disclosure generally relates to modular data centers and in particular to air cooling of heat-generating equipment of a modular data center.

2. Description of the Related Art

As the value and use of information continue to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or be configured for a specific user or specific use, such as financial transaction processing, airline reservations, enterprise data storage, or global communications. In addition, information handling systems may include a variety of hardware and software components that may be configured to process, store, and communicate information and may include one or more computer systems, data storage systems, and networking systems.

A modular data center (MDC) contains data center equipment such as information handling systems, data storage, and networking equipment that are typically housed in a container that is transported to a desired location. An MDC typically also includes power and cooling systems. The data center equipment, such as components of the information handling systems, are housed within one or more racks positioned between a cold aisle and a hot aisle of the container. Equipment panels are attached to an exterior of the container of the MDC for ease of access or to reduce internal size of the container. All equipment installed in each equipment panel are exposed to heat from an external environment and can also become hot during operation.

BRIEF SUMMARY

According to aspects of the present disclosure, a modular data center (MDC), an air handling system of an MDC, and a method for assembling an MDC provide for air cooling of components within a volumetric container and equipment contained in equipment panels attached externally to the volumetric container.

According to one embodiment, an MDC includes a volumetric container having a cooling air inlet supplying cold air to a cold aisle identified within the container and an exhaust air outlet receiving hot air from a hot aisle. At least one heat-generating information technology (IT) component is positioned within the volumetric container between the cold aisle and the hot aisle. The at least one IT component has air passages for passing through cooling air from the cold aisle to the hot aisle. A cooling unit pressurizes the cold aisle with supply air and draws return air from the hot aisle. One or more equipment panels are externally attached to an exterior wall of the volumetric container and contain heat-generating equipment. A supply air conduit directs supply air from the cold aisle to at least one of the one or more equipment panels. A return air conduit directs air warmed by the heat-generating equipment into the hot aisle from at least one of the one or more equipment panels that receives the supply air.

According to another embodiment, an air handling system includes a volumetric container having a mounting location for at least one heat-generating IT component positioned within the volumetric container. A cold aisle is defined on one side of the at least one IT component and a hot aisle is defined on another side of the at least one IT component, the at least one IT component having air-cooling air passages that fluidly communicate cooling air between the cold and the hot aisles. A cooling unit pressurizes the cold aisle with supply air and draws return air from the hot aisle. One or more equipment panels are externally attached to an exterior wall of the volumetric container and contain heat-generating equipment. A supply air conduit directs supply air from the cold aisle to at least one of the one or more equipment panels. A return air conduit directs air warmed by the heat-generating equipment into the hot aisle from at least one of the one or more equipment panels that receives the supply air.

According to an additional embodiment, a method is provided for assembling an MDC. The method includes providing a volumetric container having a mounting location for at least one heat-generating IT component positioned within the volumetric container. A cold aisle is defined on one side of the at least one IT component and a hot aisle is defined on another side of the at least one IT component. The at least one IT component has internal air-cooling air passages that fluidly communicate cooling air between the cold and the hot aisles. The method includes attaching one or more equipment panels externally to an exterior wall of the volumetric container, the equipment panels containing heat-generating equipment. The method includes coupling, to the volumetric container, a supply air conduit that directs supply air from the cold aisle to at least one of the one or more equipment panels. The method includes coupling, to the volumetric container, a return air conduit that directs air warmed by the heat-generating equipment in the one or more equipment panels that receives the supply air to the hot aisle within the volumetric container. The method includes coupling, to the volumetric container, a cooling unit that pressurizes the cold aisle with supply air and draws return air from the hot aisle.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments can be read in conjunction with the accompanying figures. It will be appreciated that for simplicity and clarity of illustration, elements illustrated in the figures have not necessarily been drawn to scale. For example, the dimensions of some of the elements are exaggerated relative to other elements. Embodiments incorporating teachings of the present disclosure are shown and described with respect to the figures presented herein, in which.

DETAILED DESCRIPTION

Figure 1:
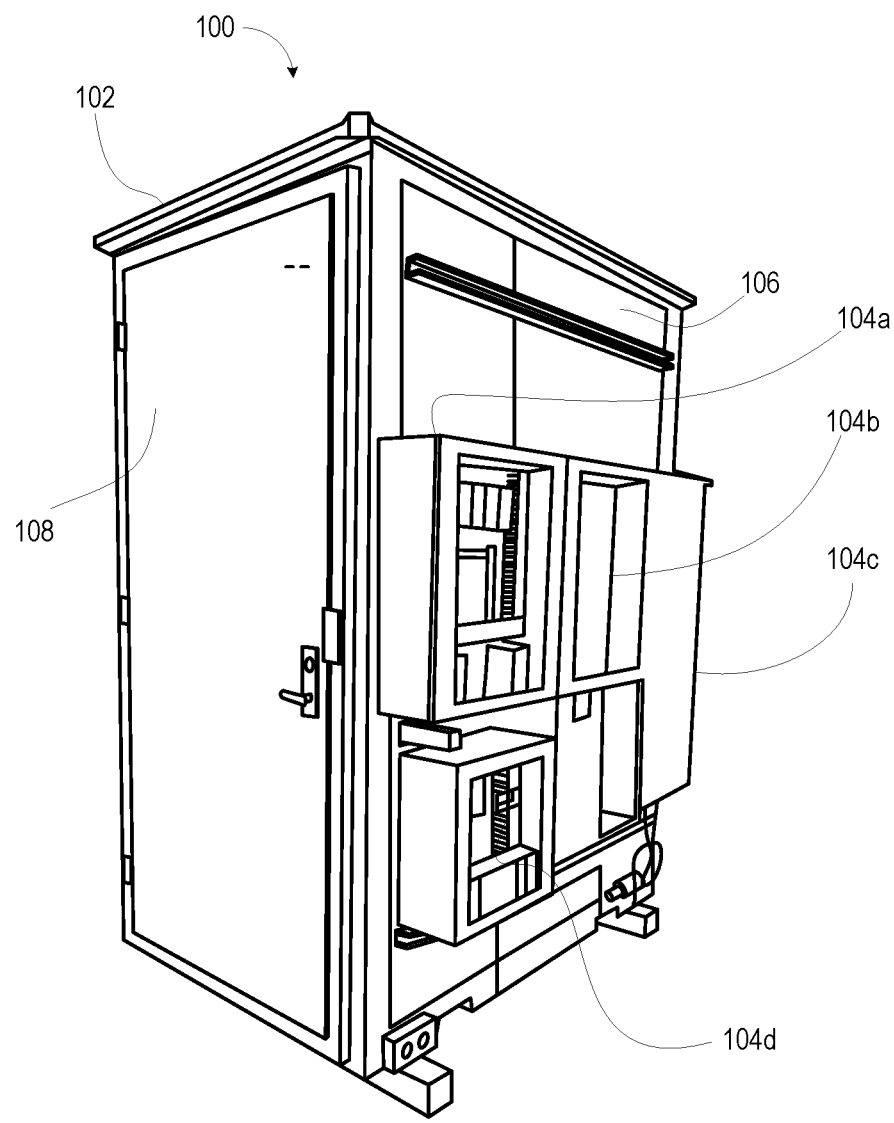
FIG. 1 is a right front perspective view of an example modular data center (MDC) having a volumetric container with externally attached equipment panels, according to one or more embodiments.

The illustrative embodiments provide a modular data center (MDC), an air handling system of an MDC, and a method for assembling of an MDC that provide for air cooling of components within a volumetric container and equipment contained in equipment panels attached externally to the volumetric container. In one or more embodiments, a volumetric container is provided having a mounting location for at least one heat-generating information technology (IT) component positioned within the volumetric container. A cold aisle is defined on one side of the at least one IT component and a hot aisle is on another side of the at least one IT component. The at least one IT component has air-cooling air passages that fluidly communicate cooling air between the cold and the hot aisles. A cooling unit is coupled to the volumetric container. The cooling unit pressurizes the cold aisle with supply air and draws return air from the hot aisle. One or more equipment panels are externally attached to an exterior wall of the volumetric container and contain heat-generating equipment. A supply air conduit directs supply air from the cold aisle to at least one of the one or more equipment panels. A return air conduit directs air warmed by the heat-generating equipment into the hot aisle from at least one of the one or more equipment panels that receives the supply air.

In the following detailed description of exemplary embodiments of the disclosure, specific exemplary embodiments in which the disclosure may be practiced are described in sufficient detail to enable those skilled in the art to practice the disclosed embodiments. For example, specific details such as specific method orders, structures, elements, and connections have been presented herein. However, it is to be understood that the specific details presented need not be utilized to practice embodiments of the present disclosure. It is also to be understood that other embodiments may be utilized, and that logical, architectural, programmatic, mechanical, electrical and other changes may be made without departing from general scope of the disclosure. The following detailed description is, therefore, not to be taken in a limiting sense, and the scope of the present disclosure is defined by the appended claims and equivalents thereof.

References within the specification to "one embodiment," "an embodiment," "embodiments", or "one or more embodiments" are intended to indicate that a particular feature, structure, or characteristic described in connection with the embodiment is included in at least one embodiment of the present disclosure. The appearance of such phrases in various places within the specification are not necessarily all referring to the same embodiment, nor are separate or alternative embodiments mutually exclusive of other embodiments. Further, various features are described which may be exhibited by some embodiments and not by others. Similarly, various requirements are described which may be requirements for some embodiments but not other embodiments.

It is understood that the use of specific component, device and/or parameter names and/or corresponding acronyms thereof, such as those of the executing utility, logic, and/or firmware described herein, are for example only and not meant to imply any limitations on the described embodiments. The embodiments may thus be described with different nomenclature and/or terminology utilized to describe the components, devices, parameters, methods and/or functions herein, without limitation. References to any specific protocol or proprietary name in describing one or more elements, features or concepts of the embodiments are provided solely as examples of one implementation, and such references do not limit the extension of the claimed embodiments to embodiments in which different element, feature, protocol, or concept names are utilized. Thus, each term utilized herein is to be given its broadest interpretation given the context in which that term is utilized.

FIG. 1 depicts a right front perspective view of an example MDC 100 having a volumetric container 102 with equipment panels 104a-d externally attached to a front external wall 106. Equipment panels 104a-d provide access, respectively, to controls, security, power, and network equipment. Equipment panels 104a-d are electrically coupled to components inside of volumetric container 102. Some of the components are physically accessible via right door 108.

Figure 2:
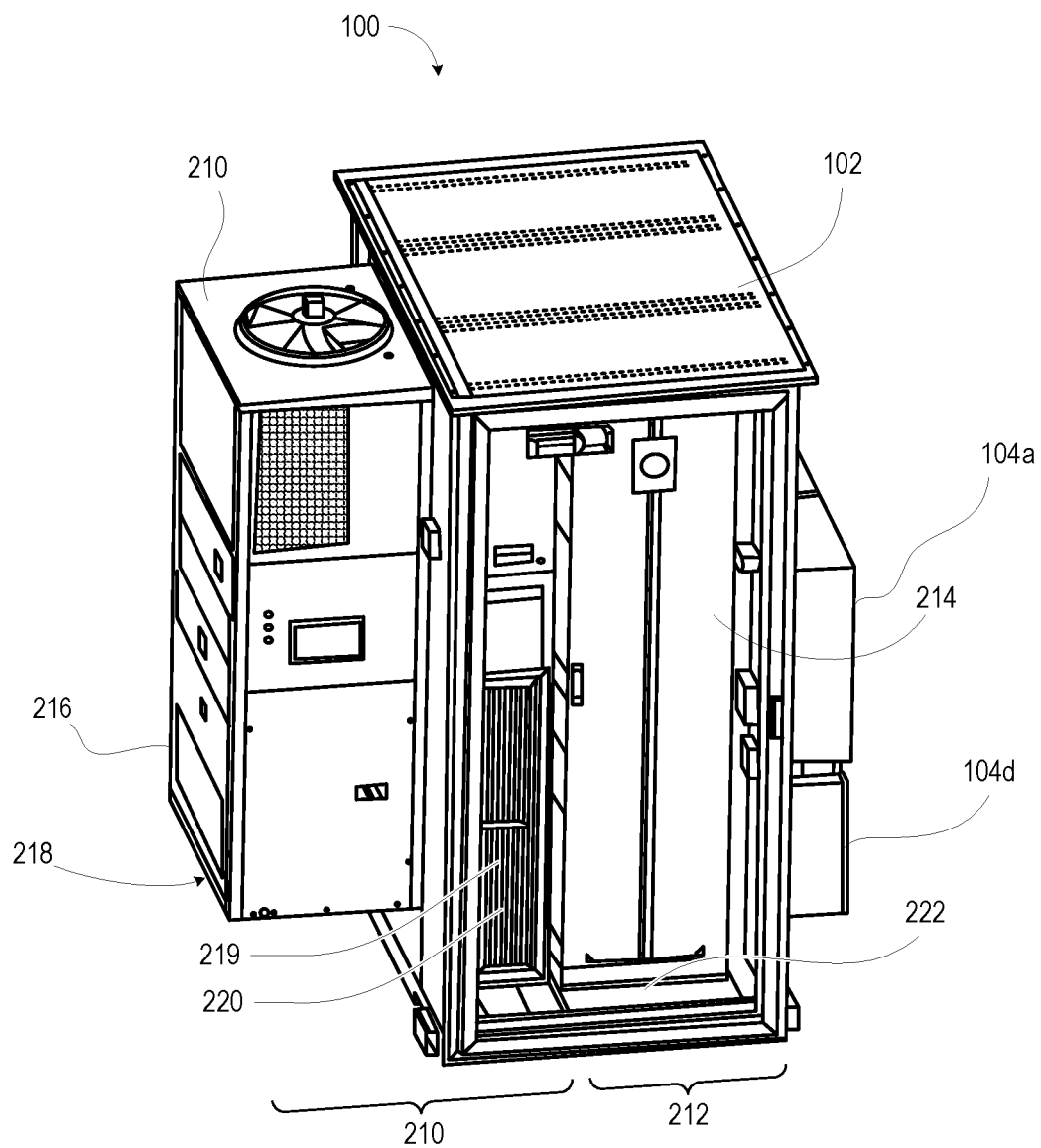
FIG. 2 is a top right view of the example MDC of FIG. 1 having a cold aisle beside a rack information handling system (RIHS) containing information technology (IT) components, according to one or more embodiments.

FIG. 2 depicts a top right view of example MDC 100 having operation components 210 and information technology (IT) components 212. In one or more embodiments, IT components are installed as rack information handling system (RIHS) 214. For clarity, volumetric container 102 is sized and palletized for forklift handling as a micro-MDC to enclose one or two RIHSs 214. In one or more other embodiments, MDC 100 can include a larger volumetric container 102 or be assembled from multiple volumetric containers 102. Within the general context of IHSs, RIHS 214 may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, RIHS 214 may be a personal digital assistant (PDA), a consumer electronic device, a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. RIHS 214 may also include one or more buses operable to transmit communications between the various hardware components. In one or more embodiments, RIHS 214 is rack-mounted to provide computing, communication and storage functionality in MDC 100.

Operation Technology (OT) components 210 include an air handling system 216 that routes cooling air through RIHS 214. Air handling system 216 includes air handling unit (AHU) 218 that is externally mounted on volumetric container 102 to provide supply air that is routed by louvered outlet 219 of air redirection structure 220 of air handling system 216 to cold aisle 222 on the right side of RIHS 214.

Figure 3:
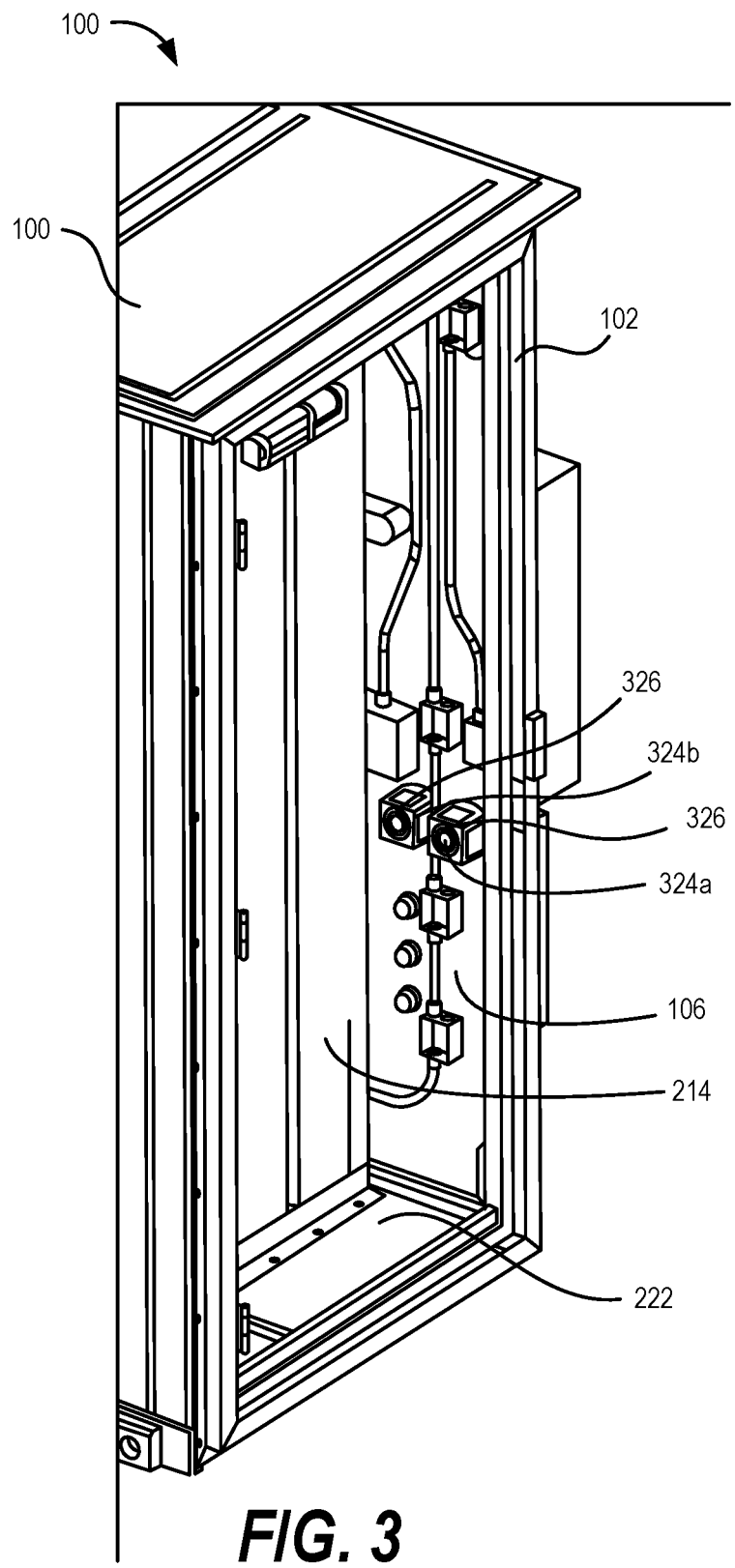
FIG. 3 is an aft right view of the example MDC of FIG. 1 having cold air ports that direct cooling air to an equipment panel, according to one or more embodiments.

FIG. 3 depicts an aft right view of example MDC 100 having cold air ports 324*a-b* mounted through front external wall 106 of volumetric container 102. Cold air ports 324*a-b* extend through the front external wall 106 of volumetric container 102 from an external surface of front external wall 106 to an internal surface. Cold air ports 324*a-b* direct cooling air to at least equipment panel 104*a* from cold aisle 222. Cold air ports 324*-b* include slotted or metered cover 326 that restricts an amount of cooling air that enters cold air ports 324*-b* so that an appropriate amount of cooling air is delivered to RIHS 214.

Figure 4:
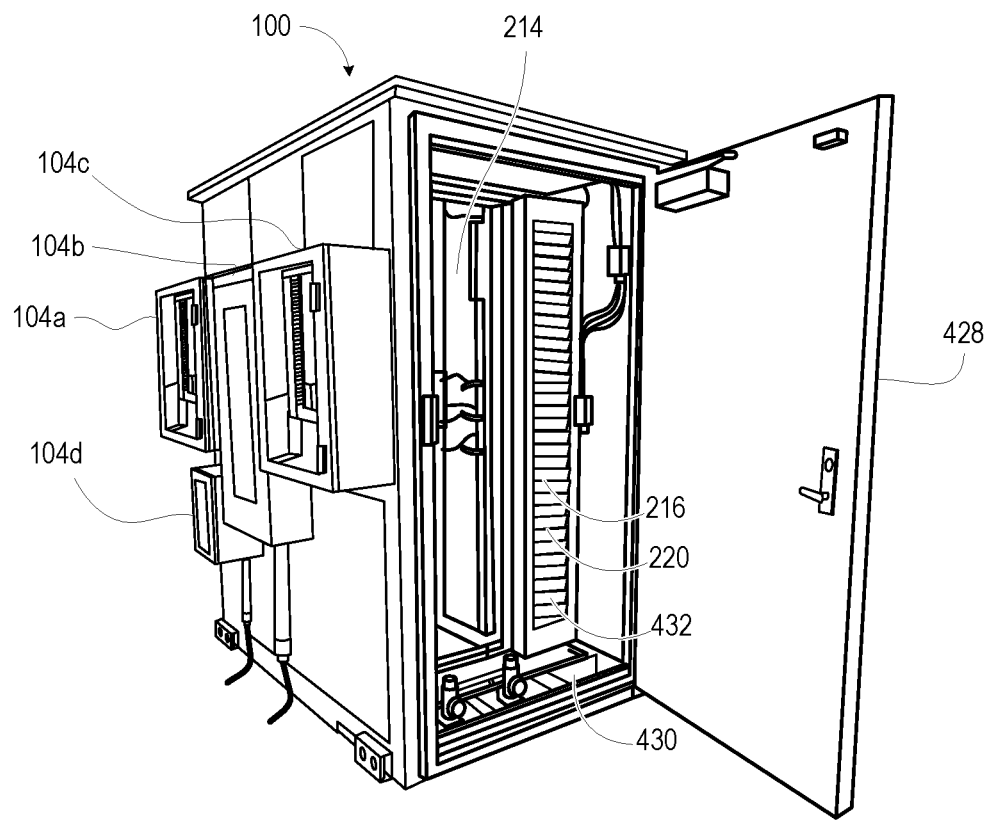
FIG. 4 is a front left view of the example MDC of FIG. 1 having a hot aisle beside the RIHS, according to one or more embodiments.

FIG. 4 depicts a front left view of example MDC 100 having left door 428 open to expose hot aisle 430 on a left side of RIHS 214. Louvered inlet 432 of air redirection structure 220 of air handling system 216 receives return air that is warmed by passing through RIHS 214 and equipment panels 104*a-d*

Figure 5:
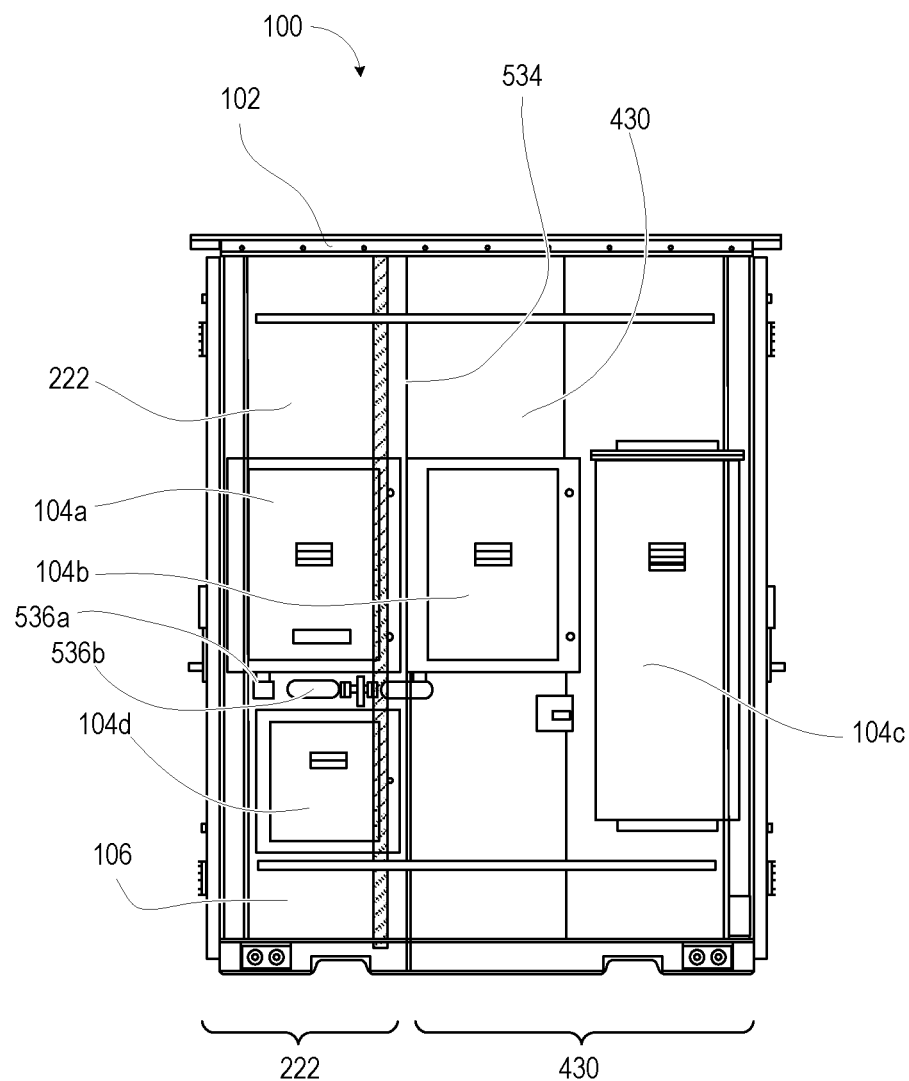
FIG. 5 is a front side view of the MDC of FIG. 1 having a volumetric container annotated with locations of the hot and cold aisles behind the equipment panels, according to one or more embodiments.

FIG. 5 depicts a front side view of MDC 100 having volumetric container 102 annotated with locations of cold and hot aisles 222 and 430 behind equipment panels 104*a-d*. Equipment panels 104*a*, 104*d* are in front of cold aisle 222. Equipment panels 104*b-c* are in front of hot aisle 430. Cold and hot aisles 222 and 430 are separated by internal containment wall 534. Cold air conduits 536*a-b* can be exteriorly mounted on front wall 106 to provide cooling air respectively to equipment panels 104*a, b* from cold air ports 324*a-b* (FIG. 3). Cold and hot air conduits, tubes, passages or ports can be interiorly mounted, to pass between volumetric container 102*b* and equipment panels 104*a-d*, and/or pass through equipment panels 104*a-d*.

Figure 6:
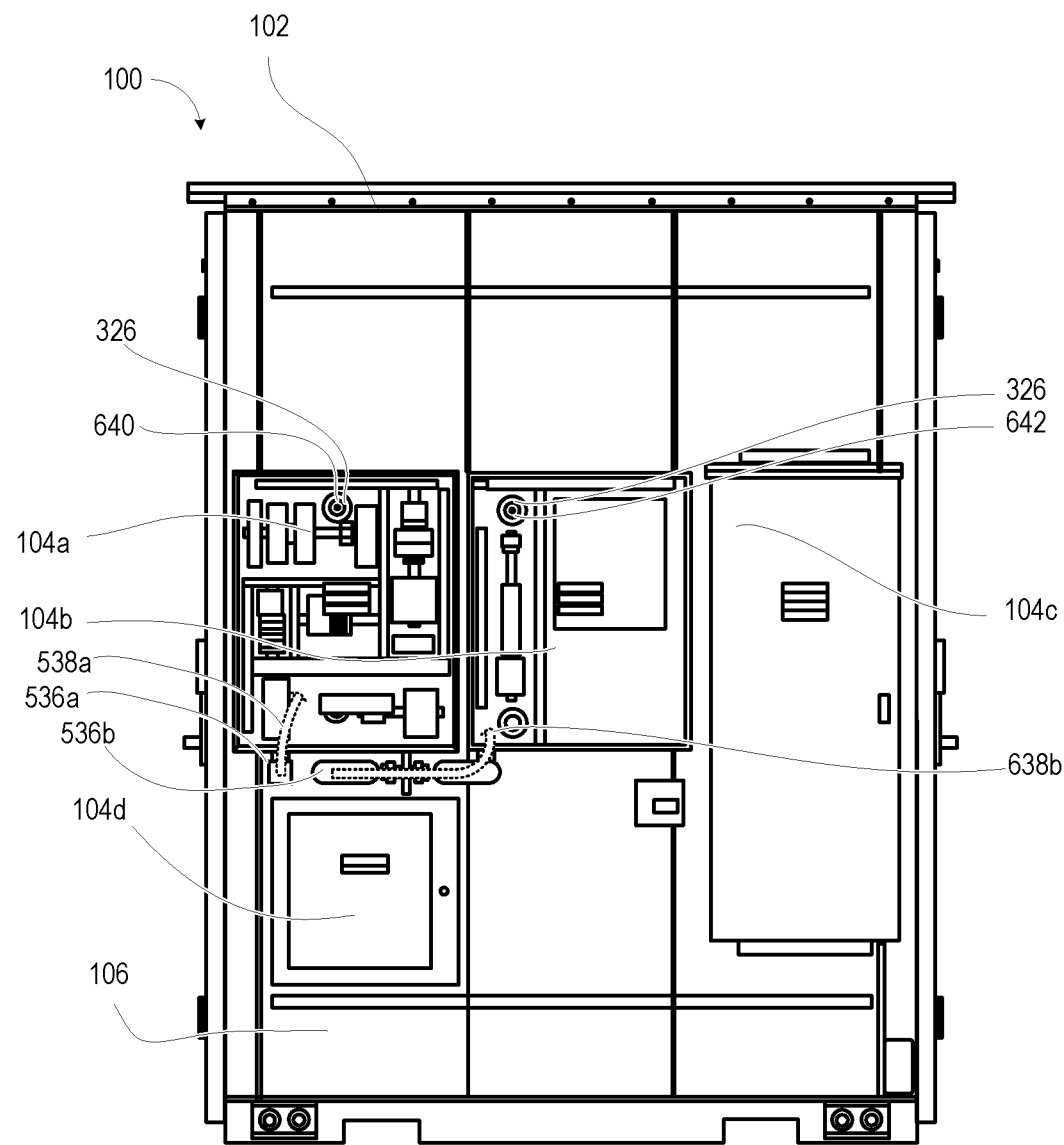
FIG. 6 is a front side view of the MDC of FIG. 1 having cooling air routed by cooling air conduits to the equipment panels, according to one or more embodiments.

FIG. 6 depicts a front side view of MDC 100 having cooling air 638*a*, 638*b* routed by cold air conduits 536*a-b* respectively to equipment panels 104*a*, 104*b* respectively. Equipment panel 104*a* exhausts warmed air via hot air port 640. Equipment panel 104*b* exhausts warmed air via hot air port 642, which vents warmed air to hot aisle 430 (FIG. 4). Equipment panel 104*c* contains network equipment that does not generate significant heat and is tolerant of a hot external embodiment. Equipment panel 104*c* does not receive air cooling. Each hot air port 640, 642 and cold air port 324*a-b* can include a metered or slotted cover 326 that restricts a portion of cooling air passing from cold aisle 222 (FIG. 2) through respective equipment panel 104*a, b, d* and back to hot aisle 430 (FIG. 4).

Figure 7:
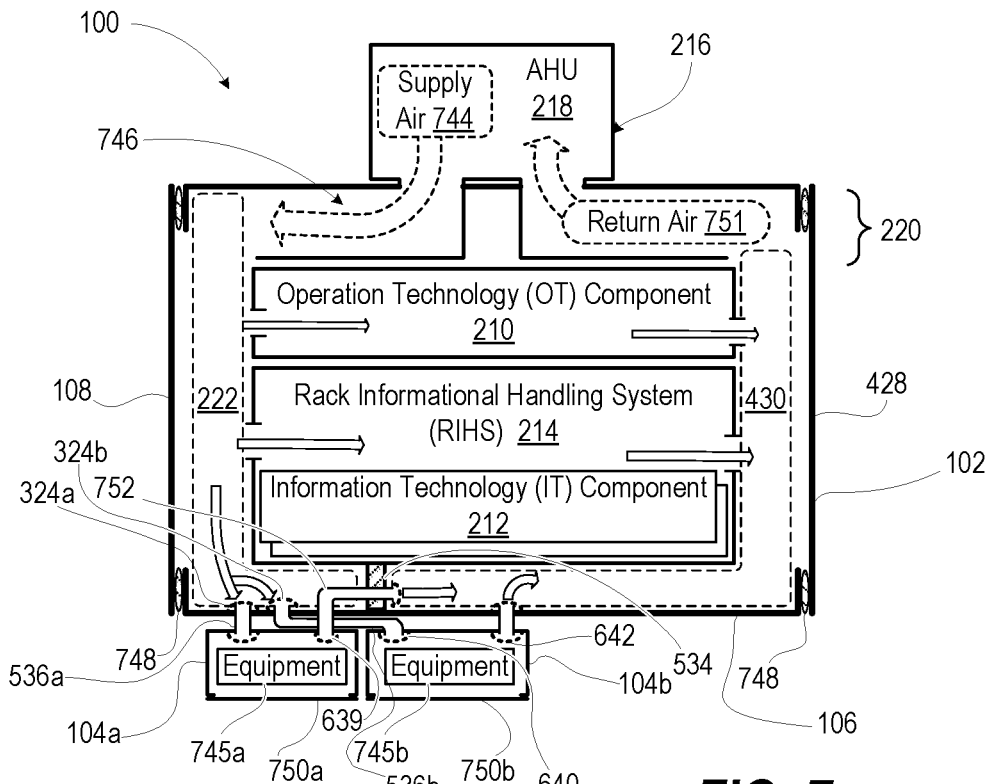
FIG. 7 is a simplified top functional diagram of an air handling system of the example MDC of FIG. 1 with independent cooling air routing to the equipment panels, according to one or more embodiments.

FIG. 7 depicts a simplified top functional diagram of MDC 100 having air handling system 216 that independently routes cooling air to equipment panels 104*a, b* and provides cooling for other components of MDC 100. AHU 218, which is exteriorly coupled to volumetric container 102, provides supply air 744. AHU 218 can prepare supply air 744, which can include recirculated air, outside air, or mixed air. AHU 218 warms, cools, dehumidifies, or humidifies the air, as required for OT components 210, IT components 212, and heat-generating equipment 745*a, b* in respective equipment panels 104*a, b*. For example, AHU 218 can cool air using direct evaporative cooling or mechanical cooling. Pressurized supply air 744 is directed by supply air plenum 746 of air redirection structure 220 to cold aisle 222. Doors 108, 428 are sealed with door seals 748 to prevent loss of cooling air. Equipment panels 104*a, b* have sealed doors 750*a-b* that are air tight to prevent loss of cooling air. AHU 218 draws return air 751 from hot aisle 430, creating a lower pressure within hot aisle 430 than cold aisle 222. In response to the pressure differential, cooling air is passively drawn through air passages in OT components 210 and RIHS 214. Internal containment wall 534 between RIHS 214 and front external wall 106 directs some cooling air from cold aisle 222 to hot aisle 430 via equipment panels 104*a-b*. In particular, cooling air passes through cold air ports 324*a* and cold air conduit 536*a* to equipment panel 104*a* to cool equipment 745*a*. In order to cool equipment 745*a*, cooling air absorbs heat from equipment 745*a* and becomes warmed air. Warmed air is pulled (via the pressure differential) and passes through hot air port 639 and hot air conduit 752 into hot aisle 430. Hot air conduit 752 passes through a hole in internal containment wall 534. Cooling air passes through cold air port 324*b*, cold air conduit 536*b*, and cold air port 640 to equipment panel 104*b* to cool equipment 745*b*. Warmed air is pulled (via the pressure differential) and passes through hot air port 642 into hot aisle 430.

Figure 8:
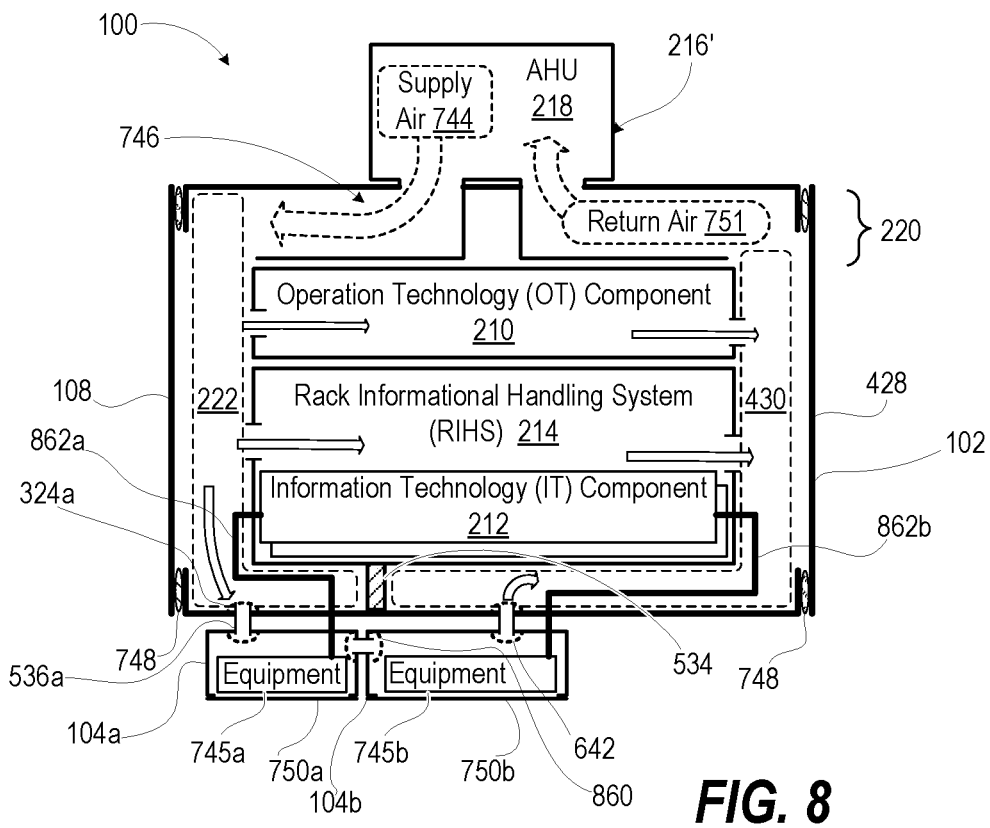
FIG. 8 is a simplified top functional diagram of an air handling system of an example MDC with serial cooling air routed by cooling air conduits to equipment panels, according to one or more embodiments.

FIG. 8 depicts a simplified top functional diagram of another example MDC 100' having air handling system 216' that sequentially routes cooling air through equipment panels 104*a, b* and provides cooling for other components of MDC 100'. Air handling system 216' is structured as described above for air handling system 216 (FIG. 7), but with modification to air handling for equipment panels 104*a-b*. In particular, cool air passes through cold air ports 324*a* and cold air conduit 536*a* to equipment panel 104*a* to cool equipment 745*a*. Warmed air passes through transfer port 860 to equipment panel 104*b* to cool equipment 745*b* (i.e., downstream of equipment 745*a*). Hot air passes through hot air port 642 into hot aisle 430 from only equipment panel 104*b*. In one embodiment, equipment panels 104*a, b* are positioned on the outside of volumetric container 102, in proximity to IT components 212 that are inside of volumetric container 102, in order to reduce the length of respective electrical cables 862*a-b* and other connections. Shorter connections can provide less communication timing and delay issues and reduce cost of materials.

Figure 9:
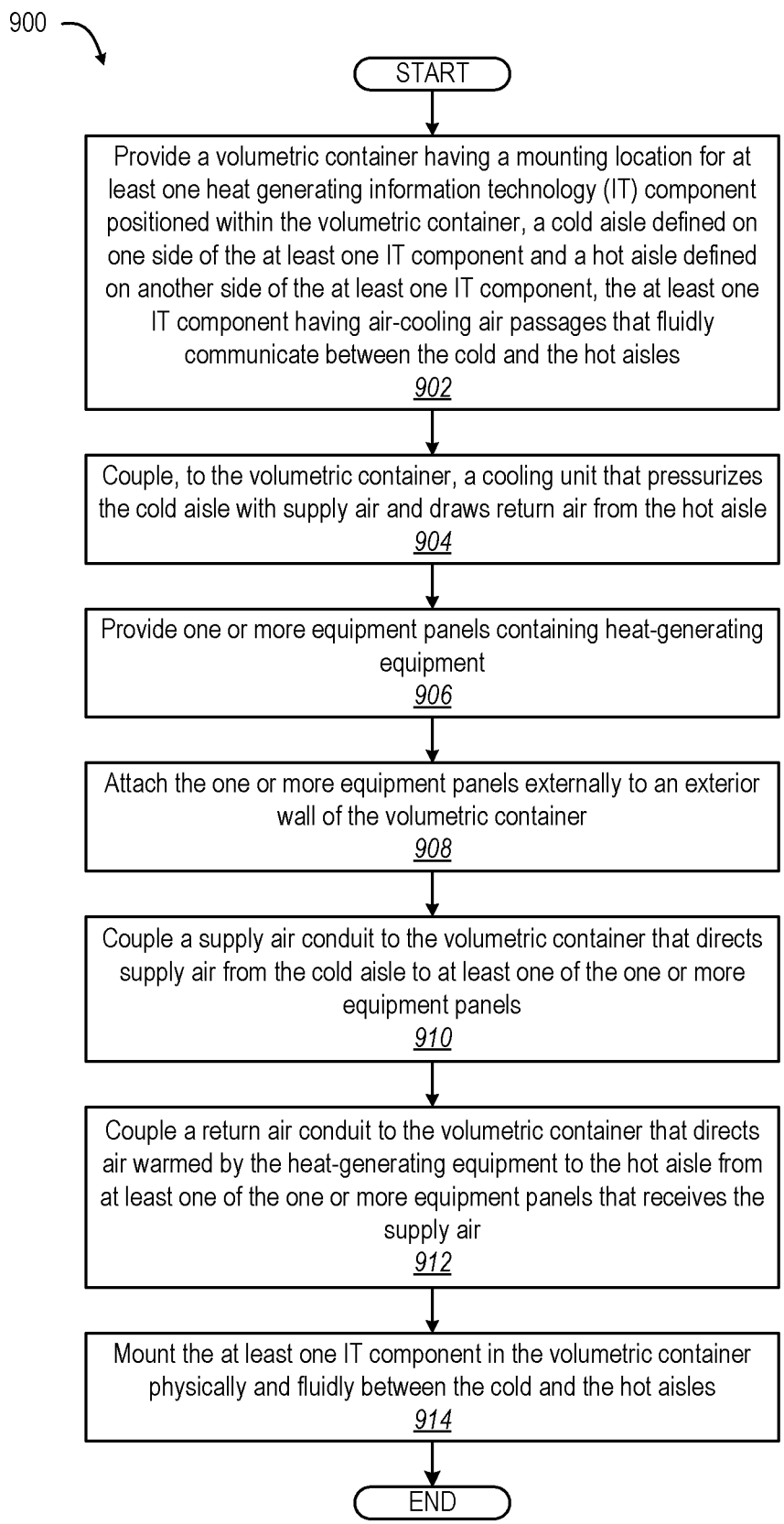
FIG. 9 is a flow diagram of a method of assembling an MDC with air cooling of external equipment panels, according to one or more embodiments.

FIG. 9 depicts a flow diagram of method 900 of assembling MDC 100 (FIG. 1) with air cooling of external equipment panels. Method 900 includes providing a volumetric container having a mounting location for at least one heat-generating information technology (IT) component positioned within the volumetric container. In one or more embodiments, method 900 includes providing the volumetric container sized as a micro-MDC for one or two RIHSs that contain the at least one heat-generating IT component. Within the volumetric container, a cold aisle is defined on one side of the at least one IT component and a hot aisle is defined on another side of the at least one IT component. Within the volumetric container, the at least one IT component has air-cooling air passages that fluidly communicate cooling air between the cold and the hot aisles (block 902). Method 900 includes coupling, to the volumetric container, a cooling unit that pressurizes the cold aisle with supply air and draws return air from the hot aisle (block 904). Method 900 includes providing one or more equipment panels containing heat-generating equipment (block 906). Method 900 includes attaching the one or more equipment panels externally to an exterior wall of the volumetric container (block 908). Method 900 includes coupling, to the volumetric container, a supply air conduit that directs supply air from the cold aisle to at least one of the one or more equipment panels (block 910). Method 900 includes coupling, to the volumetric container, a return air conduit that directs air warmed by the heat-generating equipment into the hot aisle from at least one of the one or more equipment panels that receives the supply air (block 912). Method 900 includes mounting the at least one IT component in the volumetric container physically and fluidly between the cold and the hot aisles (block 914). Then method 900 ends.

Figure 10:
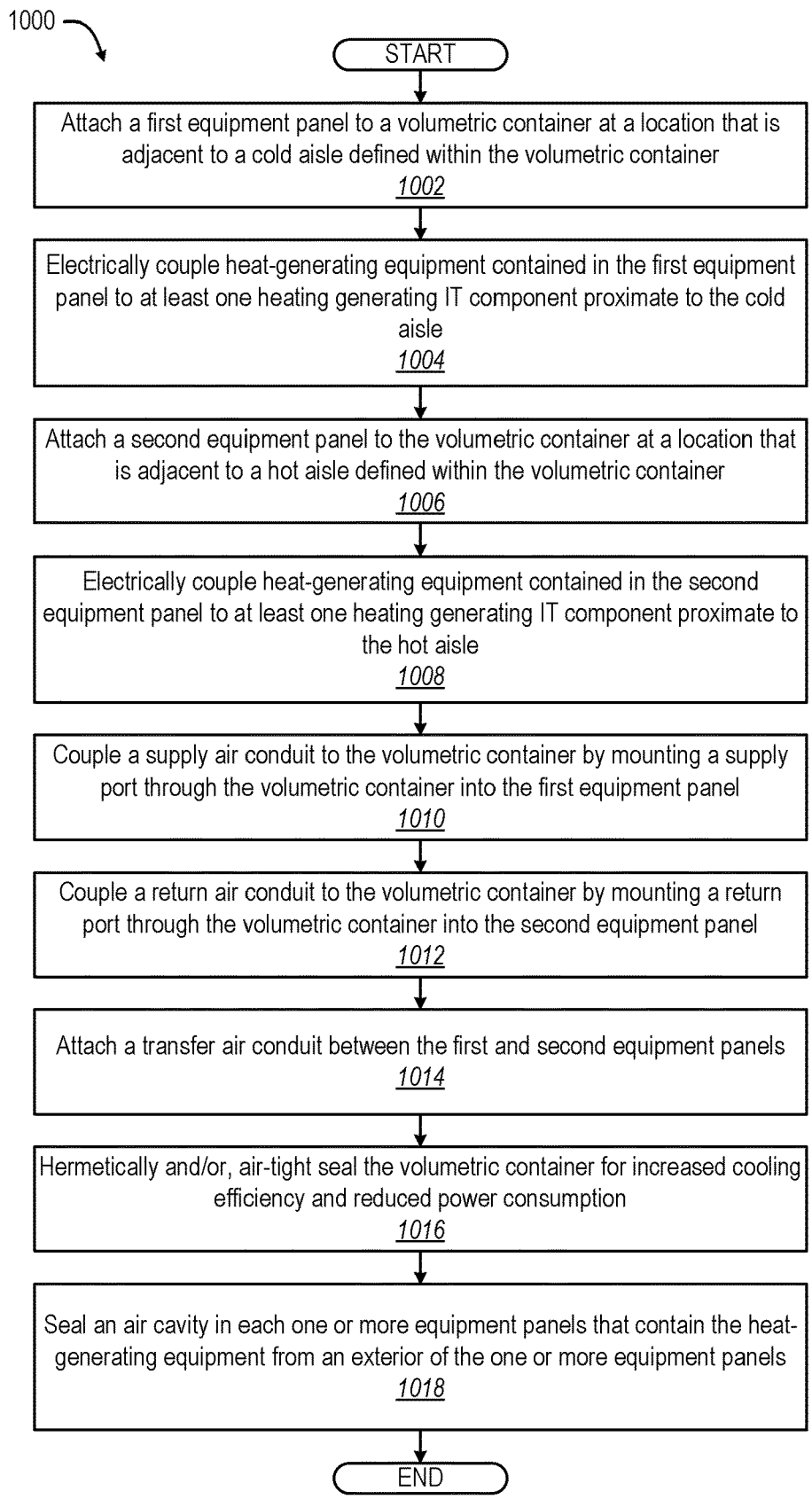
FIG. 10 present a flow diagram of a method for enhancing passive air cooling of equipment panels of the MDC, according to one or more embodiments.

FIG. 10 depicts a flow diagram of method 1000 for enhancing passive air cooling of equipment panels of MDC 100 (FIG. 1). Method 1000 includes attaching a first equipment panel to a volumetric container at a location that is adjacent to a cold aisle defined within the volumetric container (block 1002). Method 1000 includes electrically coupling heat-generating equipment contained in the first equipment panel to at least one heating generating IT component proximate to the cold aisle (block 1004). Method 1000 includes attaching a second equipment panel to the volumetric container at a location that is adjacent to the hot aisle defined within the volumetric container (block 1006). Method 1000 includes electrically coupling the heat-generating equipment contained in the second equipment panel to at least one heating generating IT component proximate to the hot aisle (block 1008). Electrical coupling can include attaching electrical cables 862*a*-*b* as described in FIG. 8. According to one embodiment, method 1000 includes providing proximity placement of the first and second equipment panels to the heat generating IT component in order to reduce the lengths of connecting components (e.g., electrical cables 862*a*-*b*). Method 1000 includes coupling a supply air conduit to the volumetric container by mounting/defining a supply port through an adjacent exterior wall of the volumetric container into the first equipment panel (block 1010). Method 1000 includes coupling the return air conduit to the volumetric container by mounting/defining a return port through the adjacent exterior wall of the volumetric container into the second equipment panel (block 1012). Method 1000 includes attaching (e.g., mounting/running/extending) a transfer air conduit between the first and second equipment panels to provide a serial connection of cooling air (block 1014). It is appreciated that in an alternate embodiment, such as is illustrated by FIG. 7, multiple direct inlets (from the cold aisle) and outlets (into the hot aisle) cooling conduits are provided to respective ones of the equipment panels that require cooling. Method 1000 includes hermetically and/or air-tight sealing the volumetric container for increased cooling efficiency and reduced power consumption (block 1016). In one or more embodiments, method 1000 includes attaching a seal to one of a doorway in the volumetric container and an edge of a door that closes the doorway to form an air tight seal. Method 1000 includes sealing an air cavity in each of one or more equipment panels that contain the heat-generating equipment from an exterior of the one or more equipment panels (block 1018). Then method 1000 ends.

In the above described flow chart, one or more of the methods may be embodied in a computer readable medium containing computer readable code such that a series of functional processes are performed when the computer readable code is executed on a computing device. In some implementations, certain steps of the methods are combined, performed simultaneously or in a different order, or perhaps omitted, without deviating from the scope of the disclosure. Thus, while the method blocks are described and illustrated in a particular sequence, use of a specific sequence of functional processes represented by the blocks is not meant to imply any limitations on the disclosure. Changes may be made with regards to the sequence of processes without departing from the scope of the present disclosure. Use of a particular sequence is therefore, not to be taken in a limiting sense, and the scope of the present disclosure is defined only by the appended claims.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. Computer program code for carrying out operations for aspects of the present disclosure may be written in any combination of one or more programming languages, including an object oriented programming language, without limitation. These computer program instructions may be provided to a processor of a general purpose computer, special purpose computer, such as a service processor, or other programmable data processing apparatus to produce a machine, such that the instructions, which execute via the processor of the computer or other programmable data processing apparatus, performs the method for implementing the functions/acts specified in the flowchart and/or block diagram block or blocks.

One or more of the embodiments of the disclosure described can be implementable, at least in part, using a software-controlled programmable processing device, such as a microprocessor, digital signal processor or other processing device, data processing apparatus or system. Thus, it is appreciated that a computer program for configuring a programmable device, apparatus or system to implement the foregoing described methods is envisaged as an aspect of the present disclosure. The computer program may be embodied as source code or undergo compilation for implementation on a processing device, apparatus, or system. Suitably, the computer program is stored on a carrier device in machine or device readable form, for example in solid-state memory, magnetic memory such as disk or tape, optically or magneto-optically readable memory such as compact disk or digital versatile disk, flash memory, etc. The processing device, apparatus or system utilizes the program or a part thereof to configure the processing device, apparatus, or system for operation.

As will be further appreciated, the processes in embodiments of the present disclosure may be implemented using any combination of software, firmware or hardware. Accordingly, aspects of the present disclosure may take the form of an entirely hardware embodiment or an embodiment combining software (including firmware, resident software, micro-code, etc.) and hardware aspects that may all generally be referred to herein as a "circuit," "module," or "system." Furthermore, aspects of the present disclosure may take the form of a computer program product embodied in one or more computer readable storage device(s) having computer readable program code embodied thereon. Any combination of one or more computer readable storage device(s) may be utilized. The computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope of the disclosure. The described embodiments were chosen and described in order to best explain the principles of the disclosure and the practical application, and to enable others of ordinary skill in the art to understand the disclosure for various embodiments with various modifications as are suited to the particular use contemplated.

What is claimed is:

1. A modular data center (MDC) comprising:
a volumetric container having a cooling air inlet supplying cold air to a cold aisle identified within the container and an exhaust air outlet receiving hot air from a hot aisle;
at least one heat-generating information technology (IT) component positioned within the volumetric container between the cold aisle and the hot aisle, the at least one IT component having air passages for passing through cooling air from the cold aisle to the hot aisle;
a cooling unit that pressurizes the cold aisle with supply air and draws return air from the hot aisle;
one or more equipment panels externally attached to an exterior wall of the volumetric container and containing heat-generating equipment;
a cold air port that extends through an external wall of the volumetric container;
a supply air conduit that extends from the cold air port at the external wall of the volumetric container to a hot air port at an external wall of at least one of the one or more equipment panels and which directs supply air from the cold aisle at the cold air port to the at least one of the one or more equipment panels, the supply air conduit being external to, and not a part of, the volumetric container; and
a return air conduit that directs air warmed by the heat-generating equipment to the hot aisle from at least one of the one or more equipment panels that receives the supply air.

2. The MDC of claim 1, wherein:
the one or more equipment panels comprise:
a first equipment panel attached to the volumetric container adjacent to the cold aisle; and
a second equipment panel attached to the volumetric container adjacent to the hot aisle;
the supply air conduit comprises a supply port through the volumetric container into the first equipment panel;
the return air conduit comprises a return port through the volumetric container into the second equipment panel; and
the MDC further comprises a transfer air conduit between the first and second equipment panels.

3. The MDC of claim 2, wherein:
the heat-generating equipment contained in the first equipment panel is electrically coupled to at least one heating generating IT component proximate to the cold aisle; and
the heat-generating equipment contained in the second equipment panel is electrically coupled to at least one heating generating IT component proximate to the hot aisle, wherein proximity placement of the first and second equipment panels reduces lengths of connecting components.

4. The MDC of claim 1, wherein:
the volumetric container comprises one or more doors that close to form an air-tight seal; and
the one or more equipment panels each comprise an air cavity containing the heat-generating equipment that is sealed from an exterior of the one or more equipment panels.

5. The MDC of claim 1, wherein the volumetric container is sized as a micro-MDC to enclose a selected one of one or two rack information handling systems that contain the at least one heat-generating IT component.

6. An air handling system comprising:
a volumetric container having a mounting location for at least one heat-generating information technology (IT) component positioned within the volumetric container, a cold aisle on one side of the at least one IT component and a hot aisle on another side of the at least one IT component, the at least one IT component having air-cooling air passages that fluidly communicate between the cold and the hot aisles;
a cooling unit that pressurizes the cold aisle with supply air and draws return air from the hot aisle;
one or more equipment panels externally attached to an exterior wall of the volumetric container and containing heat-generating equipment;
a cold air port that extends through an external wall of the volumetric container;
a supply air conduit that extends from the cold air port at the external wall of the volumetric container to a hot air port at an external wall of at least one of the one or more equipment panels and which directs supply air from the cold aisle at the cold air port to the at least one of the one or more equipment panels, the supply air conduit being external to, and not a part of, the volumetric container; and
a return air conduit that directs air warmed by the heat-generating equipment to the hot aisle from at least one of the one or more equipment panels that receives the supply air.

7. The air handling system of claim 6, wherein:
the one or more equipment panels comprise:
a first equipment panel attached to the volumetric container adjacent to the cold aisle; and
a second equipment panel attached to the volumetric container adjacent to the hot aisle;
the supply air conduit comprises a supply port through the volumetric container into the first equipment panel;
the return air conduit comprises a return port through the volumetric container into the second equipment panel; and
the air handling system further comprises a transfer air conduit between the first and second equipment panels.

8. The air handling system of claim 7, wherein:
the heat-generating equipment contained in the first equipment panel is electrically coupled to at least one heating generating IT component proximate to the cold aisle; and
the heat-generating equipment contained in the second equipment panel is electrically coupled to at least one heating generating IT component proximate to the hot aisle, wherein proximity placement of the first and second equipment panels reduces lengths of connecting components.

9. The air handling system of claim 6, wherein:
the volumetric container comprises one or more doors that close to form an air-tight seal; and
the one or more equipment panels each comprise an air cavity containing the heat-generating equipment that is sealed from an exterior of the one or more equipment panels.

10. The air handling system of claim 6, wherein the volumetric container is sized as a micro-modular data center (micro-MDC) to enclose a selected one of one or two rack information handling systems that contain the at least one heat-generating IT component.

11. A method for assembling a modular data center (MDC), the method comprising:
providing a volumetric container having a mounting location for at least one heat-generating information technology (IT) component positioned within the volumetric container, a cold aisle on one side of the at least one IT component and a hot aisle on another side of the at least one IT component, the at least one IT component having air-cooling air passages that fluidly communicate between the cold and the hot aisles;
coupling to the volumetric container a cooling unit that pressurizes the cold aisle with supply air and draws return air from the hot aisle;
attaching one or more equipment panels externally to an exterior wall of the volumetric container and containing heat-generating equipment;
coupling, to an external wall of the volumetric container, a cold air port that extends through the external wall of the volumetric container;
coupling, to the volumetric container, a supply air conduit that extends from the cold air port at the external wall of the volumetric container to a hot air port at an external wall of at least one of the one or more equipment panels and which directs supply air from the cold aisle at the cold air port to the at least one of the one or more equipment panels, the supply air conduit being external to, and not a part of, the volumetric container; and
coupling, to the volumetric container, a return air conduit that directs air warmed by the heat-generating equipment to the hot aisle from at least one of the one or more equipment panels that receives the supply air.

12. The method of claim 11, wherein:
attaching the one or more equipment panels comprises:
attaching a first equipment panel to the volumetric container adjacent to the cold aisle; and
attaching a second equipment panel to the volumetric container adjacent to the hot aisle;
coupling the supply air conduit comprises mounting a supply port through the volumetric container into the first equipment panel;
coupling the return air conduit comprises mounting a return port through the volumetric container into the second equipment panel; and
the method further comprises attaching a transfer air conduit between the first and second equipment panels.

13. The method of claim 12, wherein:
electrically coupling the heat-generating equipment contained in the first equipment panel to at least one heating generating IT component proximate to the cold aisle; and
electrically coupling the heat-generating equipment contained in the second equipment panel to at least one heating generating IT component proximate to the hot aisle, wherein proximity placement of the first and second equipment panels reduces lengths of connecting components.

14. The method of claim 11, wherein:
attaching a seal to one of a doorway in the volumetric container and an edge of a door that closes the doorway to form an air tight seal; and
sealing an air cavity in each one or more equipment panels that contain the heat-generating equipment from an exterior of the one or more equipment panels.

15. The method of claim 11, further comprising mounting the at least one IT component in the volumetric container between the cold and the hot aisles.

16. The method of claim 15, wherein mounting the at least one IT component comprises positioning a selected one of:

one or two rack information handling systems that contain the at least one heat-generating IT component within the volumetric container to form a micro-MDC.

17. The MDC of claim 1, the cold air port comprising a cover that restricts an amount of cooling air that enters the cold air port.

18. The MDC of claim 17, the cover being one of a slotted or a metered cover.

19. The air handling system of claim 6, wherein the cold air port comprises a cover that restricts an amount of cooling air that enters the cold air port, the cover being one of a slotted or a metered cover.

20. The method of claim 11, wherein the cold air port comprises a cover that restricts an amount of cooling air that enters the cold air port, the cover being one of a slotted or a metered cover.

* * * * *